United States Patent
Chen et al.

(10) Patent No.: US 9,835,897 B2
(45) Date of Patent: *Dec. 5, 2017

(54) DISPLAY MODULE

(71) Applicant: Innolux Corporation, Miao-Li County (TW)

(72) Inventors: Fu-Cheng Chen, Miao-Li County (TW); Jeng-Wei Yeh, Miao-Li County (TW); Kuei-Ling Liu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/015,238

(22) Filed: Feb. 4, 2016

(65) Prior Publication Data

US 2016/0154274 A1    Jun. 2, 2016

Related U.S. Application Data

(63) Continuation-in-part of application No. 14/054,919, filed on Oct. 16, 2013, now Pat. No. 9,285,627.

(30) Foreign Application Priority Data

Nov. 14, 2012    (CN) .......................... 2012 1 0455591

(51) Int. Cl.
    *G02F 1/1335*    (2006.01)
    *H05B 33/14*    (2006.01)
    *H01L 27/32*    (2006.01)

(52) U.S. Cl.
    CPC ...... *G02F 1/133514* (2013.01); *G02F 1/1336* (2013.01); *H01L 27/322* (2013.01);
(Continued)

(58) Field of Classification Search
    USPC .... 313/500, 501, 506, 112; 349/106, 61, 62, 349/104, 12; 362/612, 97.3, 230, 555,
(Continued)

(56) References Cited

U.S. PATENT DOCUMENTS 7,777,835 B2 * 8/2010 Park ................. G02F 1/133621
    349/106
2007/0146584 A1    6/2007 Wang et al.
(Continued)

OTHER PUBLICATIONS

EP Search Report dated Mar. 3, 2014.
Willem den Boer: "Active Matrix Liquid Crystal Displays", 2005, Elsevier, Oxford, UK, XP002720430, ISBN: 9780750678131.

*Primary Examiner* — Ashok Patel
(74) *Attorney, Agent, or Firm* — McClure, Qualey & Rodack, LLP

(57) ABSTRACT

A display module includes a light source and a display unit. The light source has an emission spectrum having maximum peak values corresponding to a first maximum peak wavelength and a second maximum peak wavelength. The display unit includes a green filter layer having a transmittance spectrum. The emission spectrum and the transmittance spectrum have a right cross-point and a left cross-point. A product of an emission intensity value of the emission spectrum corresponding to the right cross-point and a transmittance intensity value of the transmittance spectrum corresponding to the right cross-point is a first product value. A product of an emission intensity value of the emission spectrum corresponding to the left cross-point and a transmittance intensity value of the transmittance spectrum corresponding to the left cross-point is a second product value. A ratio of the first product value to the second product value is less than 20%.

18 Claims, 7 Drawing Sheets

(52) U.S. Cl.
CPC . *H05B 33/14* (2013.01); *G02F 2001/133614* (2013.01); *G02F 2001/133624* (2013.01)

(58) Field of Classification Search
USPC .......................... 362/583, 235, 249.02, 257
See application file for complete search history.

(56) References Cited

U.S. PATENT DOCUMENTS

| | | |
|---|---|---|
| 2008/0143932 A1 | 6/2008 | Cheng et al. |
| 2012/0008065 A1 | 1/2012 | Im et al. |
| 2012/0099054 A1 | 4/2012 | Takeuchi et al. |
| 2012/0162573 A1 | 6/2012 | Takahashi et al. |

* cited by examiner

DISPLAY MODULE

This is a continuation-in-part application of application Ser. No. 14/054,919, filed Oct. 16, 2013, now U.S. Pat. No. 9,285,627, which claims the benefit of People's Republic of China application serial no. 201210455591.2, filed on Nov. 14, 2012. The priority applications are incorporated herein by reference.

BACKGROUND

Field of the Invention

The disclosure relates to a display module, and more particularly to a display module capable of improving the color purity of display image.

Description of the Related Art

Along with the advance in technology, display products have become popular in people's daily life. Display products generate bright colors through the use of a color filter (CF) which filters off the light of the light source and displays the desired quality of colors.

Let the liquid crystal display (LCD) be taken for example. The LCD, being a non-active light-emitting element, firstly uses an internal backlight unit or an external ambient light (a reflective or semi-transmitting LCD) as the light source, uses a driving circuit to control liquid crystal molecules to form grey scale display, provides colors through the red(R)/green(G)/blue(B) filter layers of the color filter, and adjusts the RGB ratios, such that a color display frame can be displayed in a color mode.

As the markets have strong demand better display quality, the color filter has become a main factor to the colorization effect of the LCD. In an ideal color filter, each color filter allows only the light whose wavelength belongs to a specific range to pass through. Light leak occurs when the wavelength of the light passing through the color filter is outside the specific range. The occurrence of light leak affects the chromaticity coordinates of the white or RGB dots, and accordingly deteriorates the display quality or the color purity of display image, and cannot meet the market demand and future trend.

SUMMARY

The disclosure is related to a display module capable of improving the color purity of display image by controlling a ratio between the spectrums of a light source and the green filter layer within different wavelength intervals.

According to one embodiment of the disclosure, a display module is disclosed. The display module comprises a light source and a display unit. The light source has an emission spectrum, and the emission spectrum between 480 nm and 640 nm of wavelength has a first maximum peak value corresponding to a first maximum peak wavelength, and the emission spectrum between 380 nm and 480 nm of wavelength has a second maximum peak value corresponding to a second maximum peak wavelength. The display unit comprises a first substrate, a second substrate, a display medium, and a green filter layer disposed on the first substrate or on the second substrate, and has a transmittance spectrum. The emission spectrum and the transmittance spectrum between 640 nm and 780 nm of wavelength have a right cross-point. A product of a right emission intensity value of the emission spectrum corresponding to the right cross-point and a right transmittance intensity value of the transmittance spectrum corresponding to the right cross-point is a first product value. The emission spectrum and the transmittance spectrum between the first maximum peak wavelength and the second maximum peak wavelength have a left cross-point. A product of a left emission intensity value of the emission spectrum corresponding to the left cross-point and a left transmittance intensity value of the transmittance spectrum corresponding to the left cross-point is a second product value. A ratio of the first product value to the second product value is less than 20%, and the emission spectrum and the transmittance spectrum are normalized.

According to another embodiment of the disclosure, a display module is disclosed. The display module comprises a light source and a display unit. The light source has an emission spectrum, and the emission spectrum between 480 nm and 640 nm of wavelength has a first maximum peak value corresponding to a first maximum peak wavelength, and the emission spectrum between 380 nm and 480 nm of wavelength having a second maximum peak value corresponding to a second maximum peak wavelength. The display unit comprises a first substrate, a second substrate, a display medium, and a green filter layer disposed on the first substrate or on the second substrate, and has a transmittance spectrum. The emission spectrum and the transmittance spectrum between the first maximum peak wavelength and the second maximum peak wavelength has a left cross-point. A product of a left emission intensity value of the emission spectrum corresponding to the left cross-point and a left transmittance intensity value of the transmittance spectrum corresponding to the left cross-point is a first product value. A product of a first emission intensity value corresponding to the first maximum peak wavelength of the emission spectrum and a first transmittance intensity value corresponding to the first maximum peak wavelength of the transmittance spectrum of the green filter layer is a second product value. A ratio of the first product value to the second product value is less than 20%, and the emission spectrum and the transmittance spectrum are normalized.

The above and other aspects of the disclosure will become better understood with regard to the following detailed description of the preferred but non-limiting embodiment(s). The following description is made with reference to the accompanying drawings.

DETAILED DESCRIPTION

Figure 1A:
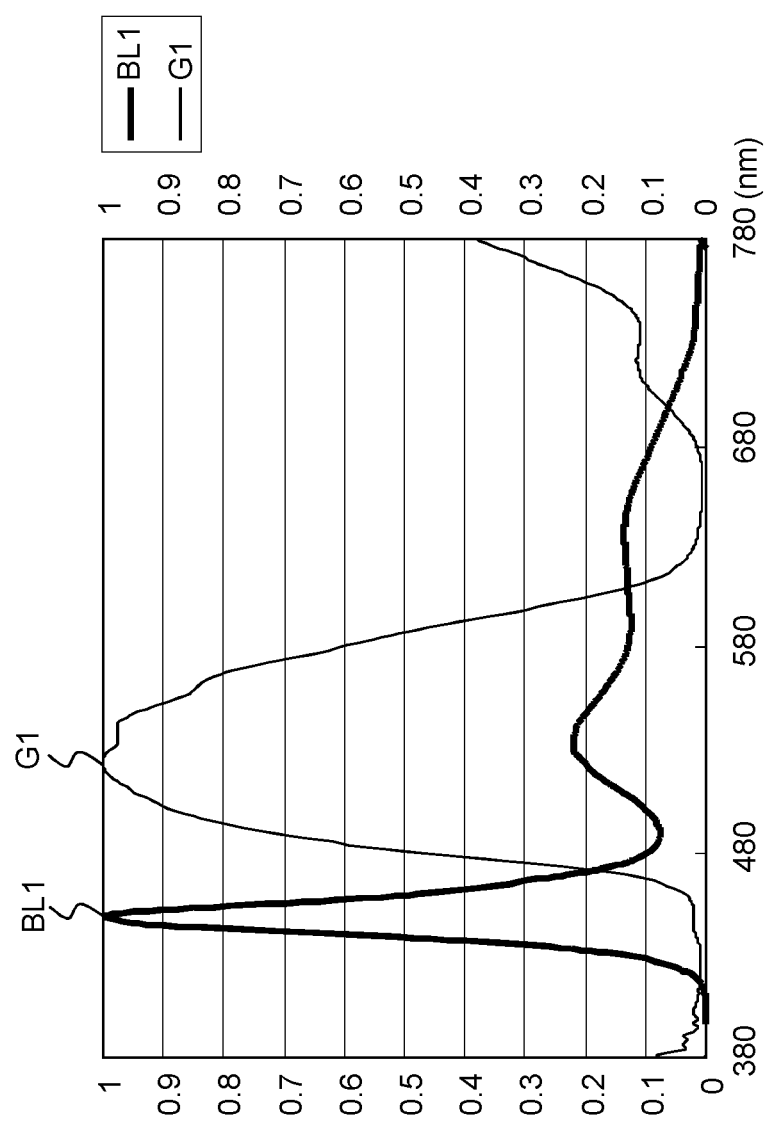
FIG. 1A shows a schematic diagram of a normalized emission spectrum of a light source and a normalized transmittance spectrum of a green filter layer.

FIG. 1A shows a schematic diagram of a normalized emission spectrum of a light source and a normalized transmittance spectrum of a green filter layer. Referring to FIG. 1A, the emission spectrum of the light source is denoted by a curve BL1. A horizontal axis of the diagram corresponds to an emission wavelength of the visible light of the light source as nanometer (nm) which is a unit of wavelength. The wavelength of the spectrum of the visible light is between 380 nm and 780 nm. A left-side vertical axis of the diagram corresponds to the emission intensity of the light source. The emission intensity (in an arbitrary unit) is shown by a relative value based on the maximum value as 1. The light source has a blue light region, a green light region, and a red light region (not illustrated) in sequence in a direction from short wavelength to long wavelength.

In FIG. 1A, a curve G1 denotes a normalized transmittance spectrum of the green filter layer. A horizontal axis of FIG. 1A corresponds to the wavelength range of the visible light able to pass through the green filter layer. The unit of the wavelength is nm. A right-side vertical axis corresponds to the transmittance rate of the light able to pass through the green filter layer. The transmittance rate (in an arbitrary unit) is shown by a relative value based on the maximum value as 1.

Figure 1B:
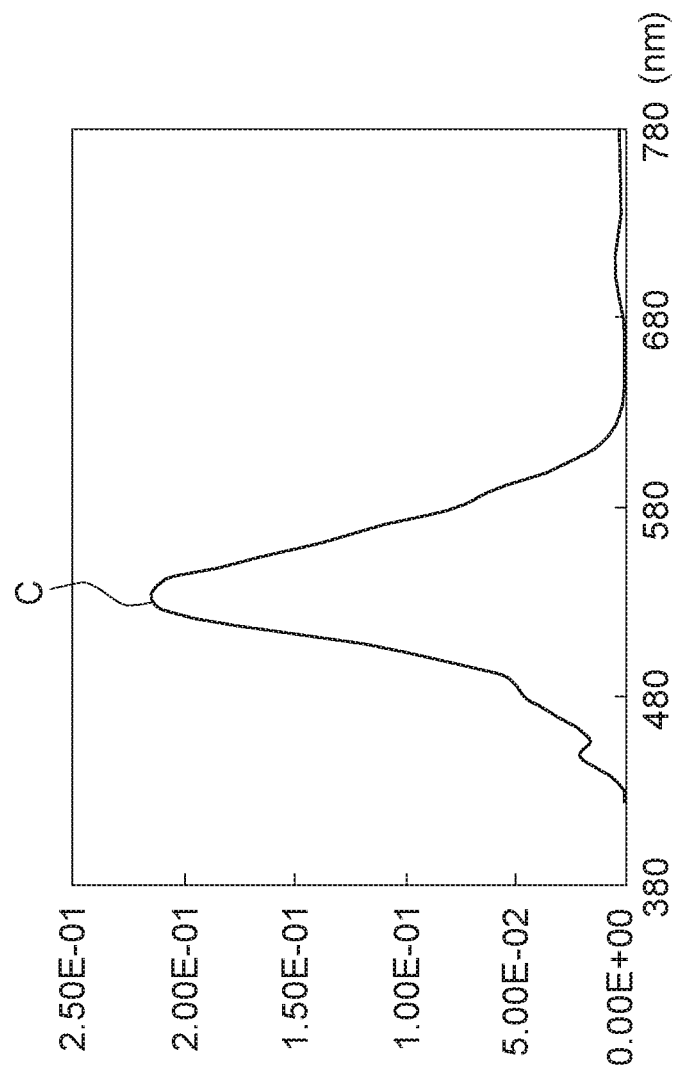
FIG. 1B shows a diagram of an multiplication spectrum of a relative transmittance energy of the light source of FIG. 1A passing through a green filter layer and a liquid crystal.

FIG. 1B shows a diagram of a multiplication spectrum of a relative transmittance energy of the light source of FIG. 1A passing through the green filter layer and a liquid crystal. An integral area of the multiplication spectrum C of FIG. 1B over the wavelength interval of the visible light is a transmittance energy of the light source passing through the green filter layer and the liquid crystal. As indicated in FIG. 1B, there is a transmitting light of the red light region between 660 nm and 780 nm of wavelength. Therefore, it is known that when the green filter layer is used, there is an existence of the transmitting light in the red light region between 660 nm and 780 nm of wavelength. FIG. 1B is exemplified by an LCD display in which a display medium providing grey scales is a liquid crystal material. In other embodiments, if an OLED display, in which an OLED emits a white light and is functioned as a display medium providing grey scales and a light source at the same time, is used, there is still a transmitting light in the red light region between 660 nm and 780 nm of wavelength after the light source passes through the green filter layer. In other embodiments, no matter what type of display is used, there is a transmitting light in the red light region between 660 nm and 780 nm of wavelength as long as the display is used in incorporated with the green filter layer. If the light source has the transmitting light in the red light region passing through the green filter layer, chromaticity coordinates of white dots will be affected.

The energy of the light source between 380 nm and 780 nm of wavelength passing through the green filter layer is defined as a first energy. The energy of the light source in the red light region between 660 nm and 780 nm passing through the green filter layer is defined as a second energy. That is, the first energy is the integral area of the multiplication spectrum C over the wavelength between 380 nm and 780 nm, and the second energy is the integral area of the multiplication spectrum C over the wavelength between 660 nm and 780 nm. If the ratio of the second energy to the first energy can be lowered, the displacement in the chromaticity coordinates of white dots will be reduced.

Figure 2:
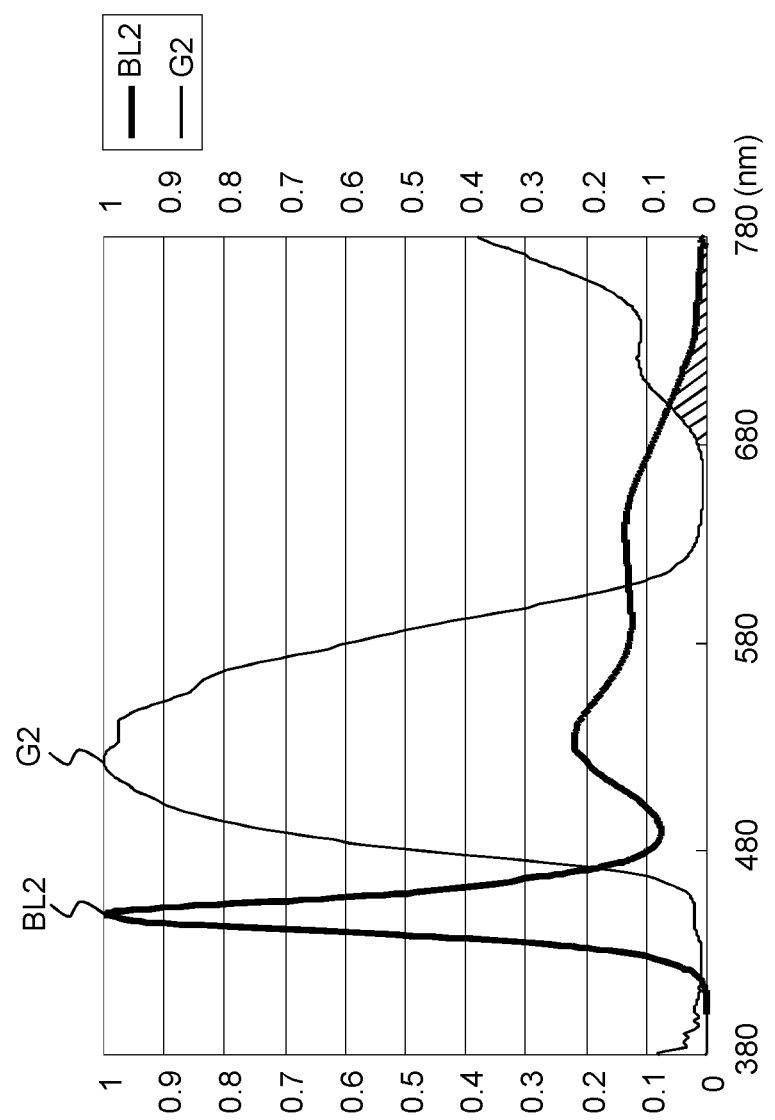
FIG. 2 shows a schematic diagram of a normalized emission spectrum of a light source and a normalized transmittance spectrum of a green filter layer.

FIG. 2 shows a schematic diagram of a normalized emission spectrum of the light source and a normalized transmittance spectrum of the green filter layer. A curve BL2 denotes an emission spectrum of the light source. The emission spectrum is measured by using three diffusion sheets disposed in the backlight unit. In FIG. 2, the horizontal axis corresponds to the emission wavelength of the light source (the unit of the wavelength is nm), the left-side vertical axis of FIG. 2 corresponds to the emission intensity of the light source. The emission intensity (in an arbitrary unit) is shown by a relative value based on the maximum value is 1.

In FIG. 2, a curve G2 denotes a transmittance spectrum of the green filter layer, the horizontal axis corresponds to the wavelength range of the light (the unit is nm) able to pass through the green filter layer. The right-side vertical axis corresponds to the transmittance rate of the green filter layer for the light. The transmittance rate (in an arbitrary unit) is a relative value based on the maximum value is 1.

Referring to FIG. 2, within the entire emission area (between 380 nm and 780 nm of wavelength) of the visible light of the light source, the overlapping part between the transmittance spectrum G2 of the green filter layer and the emission spectrum BL2 of the light source is the part of the entire emission area of the visible light of the light source that will pass through the green filter layer. However, within the red light region (between 660 nm and 780 nm of wavelength), the transmittance spectrum G2 of the green filter layer partly overlaps the emission spectrum BL2 of the light source (as indicated by the slashed area in FIG. 2). This area is the part that the light source of the red light region will pass through the green filter layer, and is an area in which red light leaks.

A relative light emission energy G of the light source after passing through the green filter layer and the liquid crystal, can be calculated according to the formula: $G = \int BLU(\lambda) \times GCF(\lambda) \times CELL(\lambda) d\lambda$. BLU ($\lambda$) denotes the emission spectrum of the light source. GCF ($\lambda$) denotes the transmittance spectrum of the green filter layer. CELL ($\lambda$) denotes the total transmittance spectrum of the remaining part of the display unit exclusive of the photoresist material (such as CF). Meanwhile, the emission energy G can be obtained by bringing wavelengths of a particular light band to the upper limit and the lower limit of the integral formula.

Therefore, the relative light emission energy of the light source after passing through the green filter layer and the liquid crystal is $G_{total}$, and can be calculated according to the formula: $G_{total} = \int_{380}^{780} BLU(\lambda) \times GCF(\lambda) \times CELL(\lambda) d\lambda$. The relative light emission energy of the light source of the red light region after passing through the green filter layer and the liquid crystal is $G_{Rleakage}$, and can be calculated according to the formula: $G_{R\ leakage} = \int_{660}^{780} BLU(\lambda) \times GCF(\lambda) \times CELL(\lambda) d\lambda$. The red light leak ratio is the ratio of $G_{Rleakage}$ to $G_{total}$. That is, $\%_{R\ leakage} = G_{R\ leakage} / G_{total}$. To resolve the red light leak occurring to the green filter layer, the range of the slashed area must be reduced, that is, the overlapping part between the emission spectrum of the light source and the green filter layer in the red light region must be reduced. The above formula is exemplified by the use of LCD display. It can be understood that when the OLED, which emits a white light, is used as the light source, the energy integral formula is an multiplication integral of the emission spectrum of the light source and the transmittance spectrum of the green filter layer.

Within the wavelength between 380 nm and 780 nm, the energy $G_{total}$ denoting the light energy of the light source passing through the green filter layer is the first energy. Within the wavelength between 660 nm and 780 nm, the energy $GR_{leakage}$ denoting the light energy of the light source passing through the green filter layer is the second energy. Therefore, if the overlapping between the emission spectrum BL2 of the light source and the transmittance spectrum G2 of the green filter layer in the red light region can be reduced, the ratio of the second energy to the first energy can be reduced accordingly.

The overlapping part between the emission spectrum of the light source and the transmittance spectrum of the green filter layer between 660 nm and 780 nm can be reduced by adjusting the kinds and composition ratio of materials of the light source in the red light region of the emission spectrum, to reduce the ratio of the second energy to the first energy, to reduce the transmittance intensity of the light source with respect to the green filter layer within the wavelength between 660 nm and 780 nm. The light source of the red light region can be generated by a group consisting of a red fluorescent powder, a red light emitting diode chip, a red quantum dot, an OLED and a combination thereof. The red fluorescent powder may comprise sulfide, nitride or silicide. The material type or composition ratio of the fluorescent powder can be adjusted.

Figure 3:
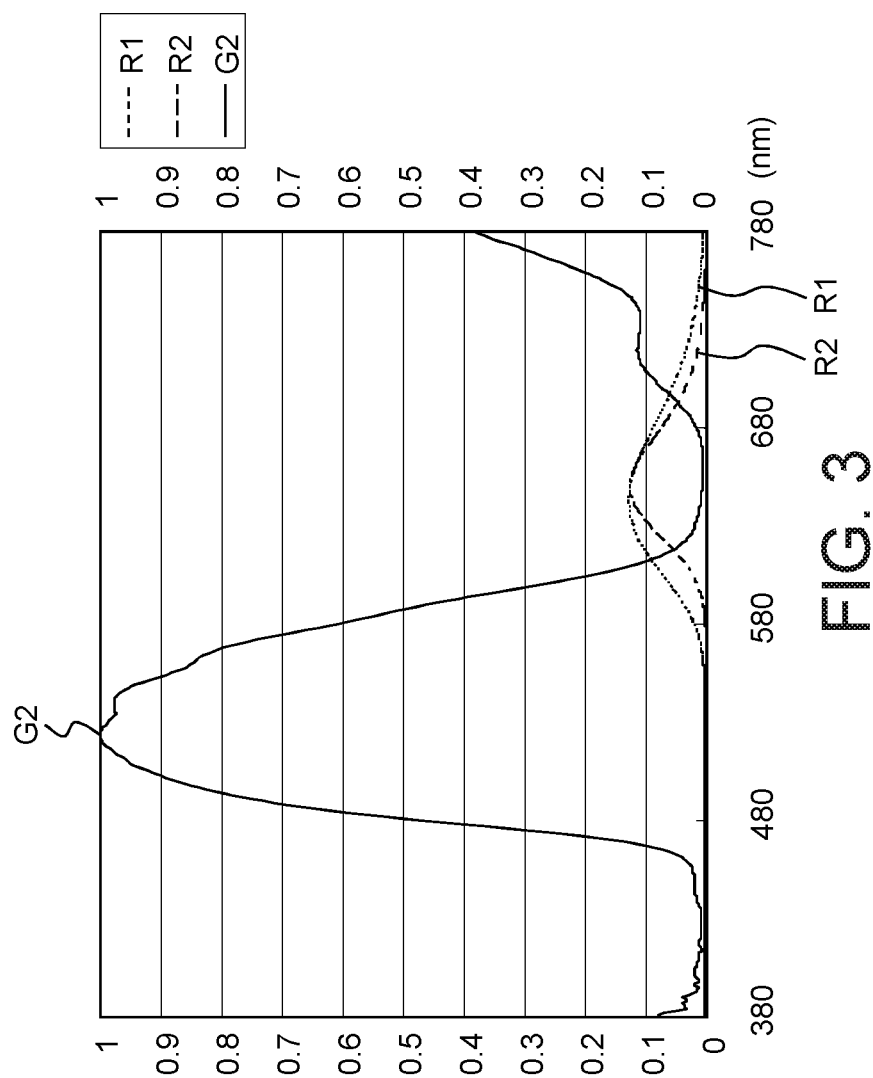
FIG. 3 shows a schematic diagram of a normalized emission spectrum of a red light region of a light source and a normalized transmittance spectrum of a green filter layer according to an embodiment of the invention.

FIG. 3 shows a schematic diagram of a normalized emission spectrum (corresponding to the left side vertical axis) of the light source of the red light region and a normalized transmittance spectrum (corresponding to the right side vertical axis) of the green filter layer according to an embodiment of the invention. A curve R1 is the emission spectrum of the ordinary light source of the red light region indicated in FIG. 2. A curve R2 is the emission spectrum of the light source in the red light region using sulfide type fluorescent powder. As indicated in FIG. 3, the full width at half maximum (FWHM) of the emission spectrum of the curve R2 is less than that of the curve R1. The positions of peaks of the curves R2 and R1 can be the same, and the invention is not limited thereto.

As indicated in FIG. 3, the ratio of the second energy (between 660 nm and 780 nm of wavelength) to the first energy (between 380 nm and 780 nm of wavelength) is about 2.87%, obtained according to an overlapping percentage between the curve R1 and the transmittance spectrum G2 of the green filter layer. The ratio of the second energy (between 660 nm and 780 nm of wavelength) to the first energy (between 380 nm and 780 nm of wavelength) is about 1.2%, obtained according to an overlapping percentage between the curve R2 and the transmittance spectrum G2 of the green filter layer. In comparison to the overlapping percentage between the emission spectrum of the curve R1 and the transmittance spectrum G2 of the green filter layer, the overlapping percentage between the emission spectrum of the curve R2 and the transmittance spectrum G2 of the green filter layer drops by 1.67%. That is, the light leak is reduced by 58%, largely reducing the problem of red light leak occurring to the green filter layer in the red light region. Therefore, by adjusting the material type or ingredient percentages of the light source providing the red light, the ratio of the second energy to the first energy can be reduced to be less than 2%. Preferably, the ratio of the second energy to the first energy is reduced to be less than 1%. By controlling the percentage of red light leak, red light leak which occurs when the light of the light source passes through the green filter layer is reduced, the problem of the chromaticity coordinates of the white dot can be avoided and display quality is improved. Additionally, the color purity of the display image can also be enhanced.

Figure 4:
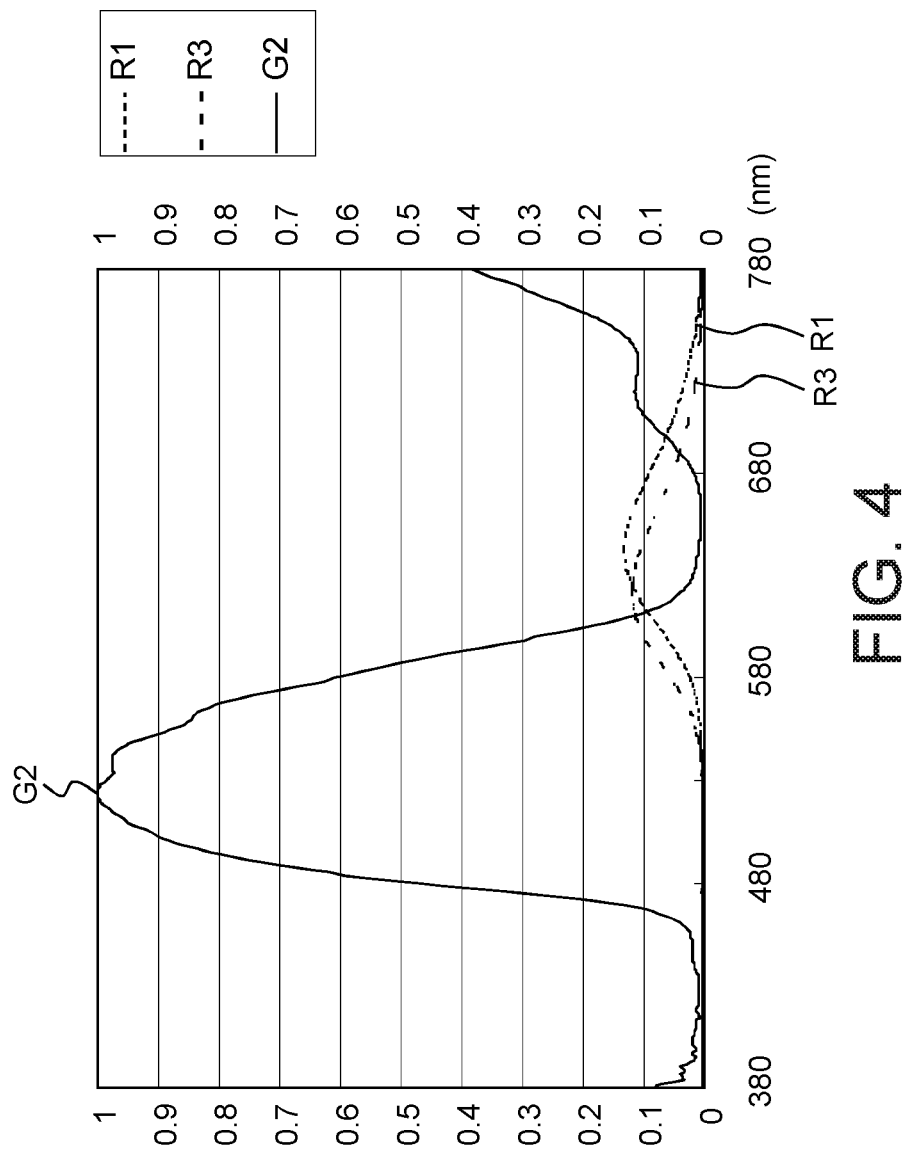
FIG. 4 shows a schematic diagram of a normalized emission spectrum of a red light region of a light source and a normalized transmittance spectrum of a green filter layer according to an embodiment of the invention.

FIG. 4 shows a schematic diagram of a normalized emission spectrum (corresponding to the left side vertical axis) of the light source of the red light region and a normalized transmittance spectrum (corresponding to the right side vertical axis) of the green filter layer according to an embodiment of the invention. The curve G2 is a transmittance spectrum of the green filter layer shown in FIG. 2. The curve R1 is an emission spectrum of the ordinary light source of the red light region shown in FIG. 2. A curve R3 is an emission spectrum of the light source using nitride fluorescent powder and has a main peak corresponding to a wavelength of 620 nm. In comparison to the main peak of the curve R1, the peak of the curve 3 is displaced towards the short wavelength area (leftward displacement). Therefore, the ratio of the second energy (between 660 nm and 780 nm of wavelength) to the first energy (between 380 nm and 780 nm of wavelength) is about 1.3%, obtained according to the overlapping percentage between the emission spectrum of the curve R3 and the transmittance spectrum G2 of the green filter layer represented by. In comparison to the overlapping percentage between the emission spectrum of the curve R1 and the transmittance spectrum G2 of the green filter layer (2.87%) shown in FIG. 4, and the overlapping percentage between the emission spectrum of the curve R3 and the transmittance spectrum G2 of the green filter layer (1.3%) drops by 1.57%. That is, the light leak is reduced by 55%, largely reducing the problem of red light leak occurring to the green filter layer in the red light region. Therefore, by adjusting the material type or ingredient percentages of the light source providing the red light, the ratio of the second energy to the first energy can be reduced to be less than 2%. Preferably, the ratio of the second energy to the first energy is reduced to be less than 1%. By controlling the percentage of red light leak, less red light leak will occur when the light of the light source passes through the green filter layer.

Figure 5:
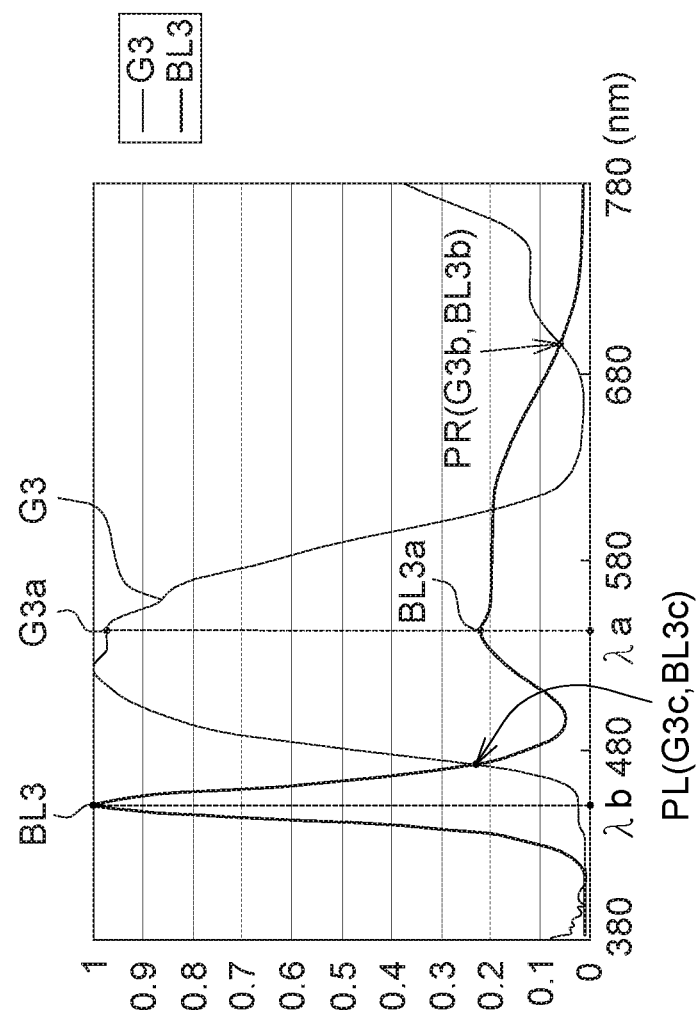
FIG. 5 shows a schematic diagram of a normalized emission spectrum of a light source and a normalized transmittance spectrum of a green filter layer according to an embodiment of the invention.

FIG. 5 shows a schematic diagram of a normalized emission spectrum of the light source and a normalized transmittance spectrum of the green filter layer according to an embodiment of the invention. A curve G3 denotes the normalized transmittance spectrum of the green filter layer according to an embodiment of the invention. A curve BL3 denotes a normalized emission spectrum of the light source according to an embodiment of the disclosure. In the present embodiment, after the emission spectrum and the transmittance spectrum are normalized, the emission spectrum and the transmittance spectrum are illustrated in the same spectrum diagram according to the Cartesian coordinates, such that the emission spectrum and the transmittance spectrum can use the same coordinate ranges in the x-axis and the y-axis. As indicated in the spectrum diagram of FIG. 5, the horizontal axis corresponds to the wavelength of the light able to pass through the green filter layer and the emission wavelength of the light source (the unit is nm). The vertical axis corresponds to the normalized transmittance rate of the wavelength of the light able to pass through the green filter layer. The value of the vertical axis is an arbitrary unit.

In the present embodiment, the emission spectrum (curve BL3) of the light source may comprise a blue light region, a green light region and a red light region for providing a blue light region, a green light region and a red light region, respectively. The red light region can be generated by a group consisting of a red fluorescent powder, a red light emitting diode chip, a red quantum dot, an OLED or a combination thereof. The red fluorescent powder may comprise nitride, such as a nitride whose light emitting peak corresponds to a wavelength between 600 nm and 630 nm (such as 620 nm), or a material whose emission spectrum of red light region has narrower full width at half maximum, such as sulfide.

In the present embodiment, the emission spectrum BL3 between 480 nm and 640 nm of wavelength has a first maximum peak value BL3a corresponding to a first maximum peak wavelength λa, and the emission spectrum BL3 between 380 nm and 480 nm of wavelength having a second maximum peak value corresponding to a second maximum peak wavelength λb. The emission spectrum and the transmittance spectrum between 640 nm and 780 nm of wavelength has a right cross-point PR, and the emission spectrum and the transmittance spectrum between the first maximum peak wavelength λa and the second maximum peak wavelength λb has a left cross-point PL.

In the present embodiment, in the wavelength range between 480 nm and 640 nm, the product of the first maximum peak value BL3a of the normalized emission spectrum BL3 of the light source corresponding to a first maximum peak wavelength λa, and a first maximum peak value G3a corresponding to the first maximum peak wavelength λa of the normalized transmittance spectrum G3 of the green filter layer is a first product value. In the wavelength range between 640 nm and 780 nm, the product of a right emission intensity value BL3b of the normalized emission spectrum BL3 and a right transmittance intensity value G3b of the normalized transmittance spectrum G3, corresponding to the right cross-point PR between the normalized emission spectrum BL3 and the normalized transmittance spectrum G3, is a second product value. The ratio of the second product value to the first product value is less than 2%. Preferably the ratio of the second product value to the first product value is reduced to be less than 1%.

In an exemplary embodiment, as indicated in FIG. 5, in the wavelength range between 480 nm and 640 nm, the first maximum emission peak value BL3a of the normalized emission spectrum BL3 is 0.22, and the first transmittance intensity value G3a of the normalized transmittance spectrum G3 corresponding to the first maximum peak wavelength λa is 0.97, so the first product value is 0.2134. In the wavelength range between 640 nm and 780 nm, the right emission intensity value BL3b of the normalized emission spectrum BL3 corresponding to the right cross-point PR between the normalized emission spectrum and the normalized transmittance spectrum is 0.06, and the right transmittance intensity value G3b of the normalized transmittance spectrum G3 corresponding to the right cross-point PR is 0.06, so that the second product value is 0.0036. Therefore, the ratio of the second product value to the first product value is 1.69% which is less than 2%. The ratio of the second product value to the first product value is preferably less than 1%, by adjusting the material types and ingredient percentage of the red fluorescent powder, the red light emitting diode chip, the red quantum dot, or the OLED used in the light source to make the peak of the red light region have narrower full width at half maximum or shift the peak towards short wavelength. For example, the ratio of the second product value to the first product value is less than 1%, by adjusting the ingredients of sulfide, nitride or silicide of the red fluorescent powder to shift the peak of the red light region towards short wavelength.

In the present embodiment, in the wavelength range between 480 nm and 640 nm, the product of the right emission intensity value BL3b of the emission spectrum corresponding to the right cross-point and the right transmittance intensity value G3b of the transmittance spectrum corresponding to the right cross-point PR is a first product value. In the wavelength range between 380 nm and 480 nm, the product of a left emission intensity value BL3c of the emission spectrum corresponding to the left cross-point PL and a left transmittance intensity value G3c of the transmittance spectrum corresponding to the left cross-point PL is a second product value. The ratio of the first product value to the second product value is less than 20%. In an embodiment, the ratio of the first product value to the second product value is reduced to 10%. In an embodiment, the ratio of the first product value to the second product value is reduced to 10%. By adjusting the chip of the light source or the kinds and composition ratio of materials of the fluorescent powder of the light source, the peak of the light source in the blue light region can be shifted in the direction having the shorter wavelength, or by adjusting the FWHM of the light source in the blue light region to be narrower. Moreover, by adjusting the kinds and composition ratio of materials of the green filter layer, the peak of the transmittance spectrum can also be shifted in the direction having the longer wavelength, or by adjusting the FWHM of the green filter layer in the green light region (between about 400 nm-630 nm of the wavelength) to be narrower. Therefore, the color purity of the green dot can be improved, but the brightness may be relatively affected depending on the requirements of the design, not be limited thereto. If the ratio of the first product value to the second product value is smaller, the color purity is better. When the ratio of the first product value to the second product value becomes smaller, the color purity of the green light becomes better.

In the present embodiment, in the wavelength range between 380 nm and 480 nm, the product of a left emission intensity value BL3c of the emission spectrum corresponding to the left cross-point PL and a left transmittance intensity value G3c of the transmittance spectrum corresponding to the left cross-point PL is a first product value. In the wavelength range between 480 nm and 640 nm, the product of the first emission intensity value BL3a corresponding to the first maximum peak wavelength λa of the emission spectrum and a first transmittance intensity value G3a corresponding to the first maximum peak wavelength λa of the transmittance spectrum of the green filter layer is a second product value. The ratio of the first product value to the second product value is less than 20%, such as 8%. In an embodiment, the ratio of the first product value to the second product value is reduced to 10%. In an embodiment, the ratio of the first product value to the second product value is reduced to 5%. By adjusting the chip of the light source or the kinds and composition ratio of materials of the fluorescent powder of the light source, the peak of the light source in the blue light region can be shifted in the direction having the shorter wavelength, or by adjusting the FWHM of the light source in the blue light region to be narrower. Moreover, by adjusting the kinds and composition ratio of materials of the green filter layer, the peak of the transmittance spectrum can also be shifted in the direction having the longer wavelength, or by adjusting the FWHM of the green filter layer in the green light region (between about 400 nm~630 nm of the wavelength) to be narrower. Therefore, the color purity of the green dot can be improved, but the brightness may be relatively affected depending on the requirements of the design, not be limited thereto. If the ratio of the first product value to the second product value is smaller, the color purity is better. When the ratio of the first product value to the second product value becomes smaller, the color purity of the green light becomes better.

Figure 6:
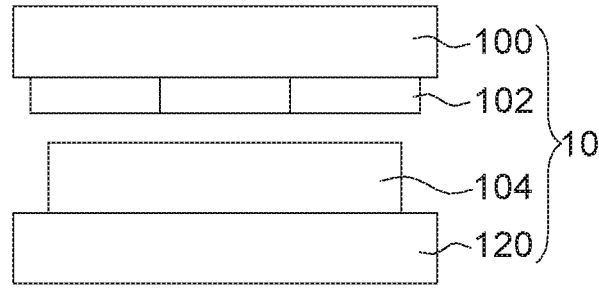
FIG. 6 shows a schematic diagram of an organic light emitting diode (OLED) display module according to an embodiment of the invention.

A display module applying the above embodiments of the invention is exemplified below. Referring to FIG. 6, a schematic diagram of an organic light emitting diode (OLED) display module 1 according to an embodiment of the invention is shown. As indicated in FIG. 6, the OLED display module 1 comprises a display unit 10. The display unit 10 comprises a first substrate 100, a color filter layer 102, an organic light emitting unit 104, and a second substrate 120. The organic light emitting unit 104 is disposed between the first substrate 100 and the second substrate 120. The color filter layer 102 is disposed on the first substrate 100, and may comprise a blue filter layer, a green filter layer and a red filter layer. The color filter layer 102 can be disposed on the second substrate 120 according to the viewer's position, and the invention is not limited thereto. The organic light emitting unit 104 is the display medium providing grey scales and the light source at the same time.

The light source generated by the organic light emitting unit 104 may comprise several spectrum regions of different colors, such as a blue light region, a green light region and a red light region, corresponding to the transmittance spectrum of the blue light emitting unit, the transmittance spectrum of the green light emitting unit and the transmittance spectrum of the red light emitting unit, respectively. In an embodiment, the light of different regions can be provided by different elements or materials. For example, the light of the blue light region can be provided by a blue LED, and the light of the red region can be provided by an OLED, and the invention is not limited thereto. Suitable design can be used as long as the emission spectrum of the light source and the transmittance spectrum of the green filter layer are conformed to the ratio of the second energy to the first energy being less than 2% as indicated in FIG. 3-4 or are conformed to the ratio of the second energy to the first energy being less than 2% as indicated in FIG. 5.

Figure 7:
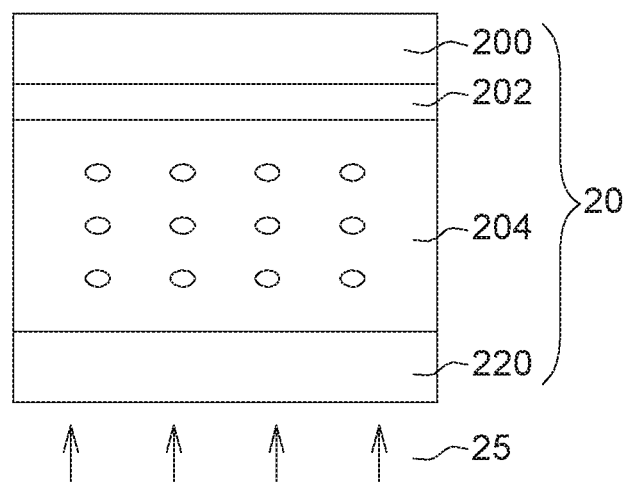
FIG. 7 shows a structural diagram of a liquid crystal display module (LCD) according to an embodiment of the invention.

Referring to FIG. 7, a structural diagram of a liquid crystal display (LCD) module 2 according to an embodiment of the invention is shown. As indicated in FIG. 7, the liquid crystal display module 2 comprises a display unit 20 and a backlight unit 25. FIG. 7 only illustrates a first substrate 200, a color filter layer 202, a liquid crystal molecule layer 204 and a second substrate 220 of the display unit 20, and other elements (such as electrodes) are omitted, for easy explanation for embodiments. The color filter layer 202 is disposed on the first substrate 200. However, the color filter layer 202 may also be disposed on the second substrate 220, such as color filters on a thin film transistor array substrate (COA). The position of the color filter layer 202 is not subjected to specific restrictions.

The backlight unit 25 is used for providing the light source comprising several spectrum regions of different colors, such as a blue light region, a green light region and a red light region. The backlight unit 25 can be implemented in different ways for providing the light source. For example, the backlight unit 25 can be implemented by packaging the red and the green fluorescent powders and the blue light emitting diode (LED) together, or packaging the YAG fluorescent powder and the blue LED together. The emission spectrum of the light source may comprise several regions of different colors (such as a blue light region, a green light region and a red light region). The red light region can be generated by a group consisting of a red fluorescent powder, a red light emitting diode chip, a red quantum dot, an OLED or a combination thereof.

In an embodiment, the red fluorescent powder comprises sulfide. In another embodiment, the material of the red light emitting unit can be designed to have a nitride whose light emitting peak is between 600 nm and 630 nm (such as 620 nm) of wavelength. The types of the blue light emitting unit and the green light emitting unit can be different from that of the red light emitting unit, and the invention is not limited thereto. For example, the red light emitting unit can be realized by an OLED, and the blue light emitting unit and the green light emitting unit can be realized by an LED. Moreover, the red light region and the green filter layer of the backlight unit 25 are conformed to the design of the ratio of the second energy to the first energy being less than 2% as indicated in FIG. 4~5 or are conformed to the design of the ratio of the second energy to the first energy being less than 2% as indicated in FIG. 5.

The above embodiments of the invention can also be applied to a touch type display device. In some embodiments, the display module 1 and the display module 2 may further comprise a touch unit (not illustrated). The touch design of the touch unit comprises a touch sensing circuit (not illustrated) and may be integrated with one of the substrates of the above embodiments. The present embodiment uses the in-cell or the on-cell touch technology, such as the in-cell photo technology, the in-cell capacitive technology, the in-cell resistive technology and the on-cell capacitive technology, for touch sensing control. Also, the touch sensing circuit can be realized by a multi-touch sensing circuit, and the invention is not limited thereto.

To summarize, given that the standards of the transmittance rate of the light source and the white dot are satisfied, the display module of the above embodiments of the invention can effectively control the percentage of red light leak and reduce the red light leak which occurs when the light of the light source passes through a green filter layer, such that the display module has better display quality.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display module, comprises:
    a light source having an emission spectrum, and the emission spectrum between 480 nm and 640 nm of wavelength having a first maximum peak value corresponding to a first maximum peak wavelength, and the emission spectrum between 380 nm and 480 nm of wavelength having a second maximum peak value corresponding to a second maximum peak wavelength; and
    a display unit, comprising:
    a first substrate;
    a second substrate;
    a display medium disposed between the first substrate and the second substrate; and
    a green filter layer disposed on the first substrate or on the second substrate, and having a transmittance spectrum, wherein the emission spectrum and the transmittance spectrum are normalized, wherein the emission spectrum and the transmittance spectrum between 640 nm and 780 nm of wavelength has a right cross-point, and a product of a right emission intensity value of the emission spectrum corresponding to the right cross-point and a right transmittance intensity value of the transmittance spectrum corresponding to the right cross-point is a first product value;

wherein the emission spectrum and the transmittance spectrum between the first maximum peak wavelength and the second maximum peak wavelength have a left cross-point, and a product of a left emission intensity value of the emission spectrum corresponding to the left cross-point and a left transmittance intensity value of the transmittance spectrum corresponding to the left cross-point is a second product value; and wherein a ratio of the first product value to the second product value is less than 20%.

2. The display module according to claim 1, wherein the ratio of the first product value to the second product value is less than 10%.

3. The display module according to claim 1, wherein the ratio of the first product value to the second product value is less than 5%.

4. The display module according to claim 1, wherein the emission spectrum of the light source comprises a red light region, and the light source comprises a red light emitting diode chip, a red quantum dot, an organic light emitting diode (OLED) or a combination thereof.

5. The display module according to claim 1, wherein the emission spectrum of the light source comprises a red light region generated by a red fluorescent powder, and a material of the red fluorescent powder comprises sulfide, nitride or silicide.

6. The display module according to claim 5, wherein the material of the red fluorescent powder is nitride, and a peak of the emission spectrum in the red light region is between 600 nm and 630 nm of wavelength.

7. The display module according to claim 1, wherein the display medium is an organic light emitting unit for providing the light source.

8. The display module according to claim 1, wherein the emission spectrum of the light source comprises a YAG fluorescent powder and a blue LED.

9. The display module according to claim 1, further comprising:
a backlight unit for providing the light source, the display medium being a liquid crystal molecule layer.

10. A display module, comprises:
a light source having an emission spectrum, and the emission spectrum between 480 nm and 640 nm of wavelength having a first maximum peak value corresponding to a first maximum peak wavelength, and the emission spectrum between 380 nm and 480 nm of wavelength having a second maximum peak value corresponding to a second maximum peak wavelength; and
a display unit, comprising:
a first substrate;
a second substrate;
a display medium disposed between the first substrate and the second substrate; and
a green filter layer disposed on the first substrate or on the second substrate, and having a transmittance spectrum, wherein the emission spectrum and the transmittance spectrum are normalized,
wherein the emission spectrum and the transmittance spectrum between the first maximum peak wavelength and the second maximum peak wavelength has a left cross-point, and
a product of a left emission intensity value of the emission spectrum corresponding to the left cross-point and a left transmittance intensity value of the transmittance spectrum corresponding to the left cross-point is a first product value;
wherein a product of a first emission intensity value corresponding to the first maximum peak wavelength of the emission spectrum and a first transmittance intensity value corresponding to the first maximum peak wavelength of the transmittance spectrum of the green filter layer is a second product value; and
wherein a ratio of the first product value to the second product value is less than 20%.

11. The display module according to claim 10, wherein the ratio of the second product value to the first product value is less than 10%.

12. The display module according to claim 10, wherein the ratio of the second product value to the first product value is less than 5%.

13. The display module according to claim 10, wherein the emission spectrum of the light source comprises a red light region generated by a red fluorescent powder, and a material of the red fluorescent powder comprises sulfide, nitride or silicide.

14. The display module according to claim 13, wherein the material of the red fluorescent powder is nitride, and a peak of the emission spectrum in the red light region is between 600 nm and 630 nm of wavelength.

15. The display module according to claim 10, wherein the emission spectrum of the light source comprises a red light region, and the light source comprises a red light emitting diode chip, a red quantum dot, an organic light emitting diode (OLED) or a combination thereof.

16. The display module according to claim 10, wherein the emission spectrum of the light source comprises a YAG fluorescent powder and a blue LED.

17. The display module according to claim 10, further comprising:
a backlight unit for providing the light source, the display medium being a liquid crystal molecule layer.

18. The display module according to claim 10, wherein the display medium is an organic light emitting unit for providing the light source.

* * * * *